(12) United States Patent
Li et al.

(10) Patent No.: US 10,193,510 B1
(45) Date of Patent: Jan. 29, 2019

(54) SWITCHING CONTROLLERS AND METHODS FOR LOADS

(71) Applicant: ON-BRIGHT ELECTRONICS (SHANGHAI) CO., LTD., Shanghai (CN)

(72) Inventors: Miao Li, Shanghai (CN); Qiang Luo, Shanghai (CN); Lieyi Fang, Shanghai (CN)

(73) Assignee: On-Bright Electronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 15/660,717

(22) Filed: Jul. 26, 2017

(30) Foreign Application Priority Data

Jul. 10, 2017 (CN) .......................... 2017 1 0557690

(51) Int. Cl.
| | |
|---|---|
| H03F 3/45 | (2006.01) |
| H03F 3/26 | (2006.01) |
| H03F 1/32 | (2006.01) |
| H03F 1/02 | (2006.01) |

(52) U.S. Cl.
CPC ....... H03F 3/45179 (2013.01); H03F 1/0205 (2013.01); H03F 1/3211 (2013.01); H03F 3/26 (2013.01)

(58) Field of Classification Search
CPC ....................................................... H03F 3/45
USPC ................................................. 330/255, 261
See application file for complete search history.

(56) References Cited

U.S. PATENT DOCUMENTS 5,155,698 A 10/1992 Gauthier
5,714,809 A * 2/1998 Clemo ................... H02H 9/004
307/125

2008/0030267 A1* 2/2008 Yang .......................... H03F 1/26
330/10
2013/0235621 A1 9/2013 Yan et al.
2015/0061626 A1* 3/2015 Archibald ................ G06F 1/26
323/282

FOREIGN PATENT DOCUMENTS

| TW | 200515114 | 5/2005 |
|---|---|---|
| TW | 201030719 | 8/2010 |
| TW | 201217936 | 5/2012 |
| TW | 201328191 | 7/2013 |

OTHER PUBLICATIONS

Taiwan Intellectual Property Office, Office Action dated Jul. 24, 2018, in Application No. 106132482.

* cited by examiner

*Primary Examiner* — Henry Choe
(74) *Attorney, Agent, or Firm* — Faegre Baker Daniels LLP

(57) ABSTRACT

System controller and method for providing at least an output voltage. For example, the system controller includes a first controller terminal configured to receive an input voltage. The input voltage is associated with an input-voltage magnitude. Additionally, the system controller includes a second controller terminal configured to receive a control voltage, and a third controller terminal configured to output an output voltage to a load. Moreover, the system controller includes a supply voltage generator configured to receive the input voltage from the first controller terminal and generate a supply voltage. The supply voltage is associated with a supply voltage magnitude. Also, the system controller includes a ramp voltage generator configured to receive the supply voltage and generate a ramp voltage.

37 Claims, 6 Drawing Sheets

SWITCHING CONTROLLERS AND METHODS FOR LOADS

1. CROSS-REFERENCES TO RELATED APPLICATIONS

This application claims priority to Chinese Patent Application No. 201710557690.4, filed Jul. 12, 2017, incorporated by reference herein for all purposes.

2. BACKGROUND OF THE INVENTION

Certain embodiments of the present invention are directed to integrated circuits. More particularly, some embodiments of the invention provide switching controllers and methods for loads. Merely by way of example, some embodiments of the invention have been applied to power transistors. But it would be recognized that the invention has a much broader range of applicability.

Power transistors have been widely used in various electronics systems. In these systems, there often are requirements on voltage ramping slopes and maximum output currents during start-up processes of the power transistors. If the start-up processes are too fast, the output currents during the start-up processes may become so large that loads of the electronics systems can be impacted or even damaged due to low on-resistance of the power transistors.

FIG. 1 is a simplified diagram showing a conventional system including discrete components for controlling ramping slope of output voltage. The system 100 includes a power MOSFET 110, a transistor 120, resistors 130, 132, 134 and 136, capacitors 140 and 142, a resistive load 150, and a capacitive load 160. The system 100 relies on the Miller plateau of the power MOSFET 110 to control the ramping slope of the output voltage.

The magnitudes of the resistors 130, 132, 134 and 136 and the capacitors 140 and 142 often need to be adjusted based on device parameters of the power MOSFET 110. As shown in FIG. 1, the system 100 uses a relatively large number of resistors and capacitors. Furthermore, the system 100 usually cannot effectively protect various components of the system or prevent fire damage to these components in response to short circuits of the loads during the start-up process of the system 100.

Hence it is highly desirable to improve the techniques related to power transistors.

3. BRIEF SUMMARY OF THE INVENTION

Certain embodiments of the present invention are directed to integrated circuits. More particularly, some embodiments of the invention provide switching controllers and methods for loads. Merely by way of example, some embodiments of the invention have been applied to power transistors. But it would be recognized that the invention has a much broader range of applicability.

According to one embodiment, a system controller for providing at least an output voltage includes a first controller terminal configured to receive an input voltage. The input voltage is associated with an input-voltage magnitude. Additionally, the system controller includes a second controller terminal configured to receive a control voltage, and a third controller terminal configured to output an output voltage to a load. Moreover, the system controller includes a supply voltage generator configured to receive the input voltage from the first controller terminal and generate a supply voltage. The supply voltage is associated with a supply voltage magnitude. Also, the system controller includes a ramp voltage generator configured to receive the supply voltage and generate a ramp voltage. If the control voltage is at a first logic level, the ramp voltage increases from zero to the supply voltage magnitude at a first rate of change during a first time duration and the output voltage increases from zero to the input-voltage magnitude at a second rate of change during a second time duration. The second rate of change is equal to the first rate of change multiplied by a predetermined constant.

According to another embodiment, a system controller for providing at least an output voltage includes a first controller terminal configured to receive an input voltage, a second controller terminal configured to receive a control voltage, a third controller terminal configured to output an output voltage, and a fourth controller terminal biased to a predetermined voltage. Additionally, the system controller includes a transistor including a gate terminal, a drain terminal and a source terminal. The drain terminal is connected to the first controller terminal, and the source terminal is connected to the third controller terminal. Moreover, the system controller includes a first resistor including a first resistor terminal and a second resistor terminal. The first resistor terminal is connected to the third controller terminal. Also, the system controller includes a second resistor including a third resistor terminal and a fourth resistor terminal. The third resistor terminal is connected to the second resistor terminal, and the fourth resistor terminal is connected to the fourth controller terminal. Additionally, the system controller includes a third resistor including a fifth resistor terminal and a sixth resistor terminal. The fifth resistor terminal is configured to receive a first voltage related to the output voltage, and the sixth resistor terminal is connected to the gate terminal of the transistor. Moreover, the system controller includes a ramp voltage generator configured to generate a ramp voltage, and a transconductance operational amplifier including a first amplifier terminal, a second amplifier terminal and a third amplifier terminal. The first amplifier terminal is configured to receive a second voltage from the second resistor terminal and the third resistor terminal, the second amplifier terminal is configured to receive the ramp voltage from the ramp voltage generator, and the third amplifier terminal is connected to the sixth resistor terminal and the gate terminal of the transistor.

According to yet another embodiment, a system controller for providing at least an output current includes a first controller terminal configured to receive an input voltage, and a second controller terminal configured to output an output current. Additionally, the system controller includes a first transistor including a first gate terminal, a first drain terminal and a first source terminal. The first drain terminal is configured to receive the input voltage, and the first source terminal is connected to the second controller terminal. Moreover, the system controller includes a second transistor including a second gate terminal, a second drain terminal and a second source terminal. The second source terminal is connected to the second controller terminal. Also, the system controller includes a first resistor including a first resistor terminal and a second resistor terminal. The first resistor terminal is configured to receive the input voltage, and the second resistor terminal is associated with a first voltage and connected to the second drain terminal. Additionally, the system controller includes a second resistor including a third resistor terminal and a fourth resistor terminal. The third resistor terminal is configured to receive a second voltage, and the fourth resistor terminal is connected to the first gate terminal of the first transistor and the second gate terminal of the second transistor. Moreover, the system controller includes a transconductance operational amplifier including a first amplifier terminal, a second amplifier terminal and a third amplifier terminal. The third amplifier terminal is connected to the fourth resistor terminal, the first gate terminal of the first transistor, and the second gate terminal of the second transistor. The transconductance operational amplifier is configured to: generate an amplified current based on at least information associated with the input voltage and the first voltage; and in response to the input voltage minus the first voltage being larger than a predetermined offset voltage, generate the amplified current flowing into the transconductance operational amplifier through the third amplifier terminal.

According to yet another embodiment, a system controller for protection includes a first controller terminal configured to receive an input voltage, a second controller terminal configured to receive a control voltage, a third controller terminal configured to output an output voltage, and a fourth controller terminal biased to a predetermined voltage. Additionally, the system controller includes a first transistor including a first gate terminal, a first drain terminal and a first source terminal. The first drain terminal is connected to the first controller terminal, and the first source terminal is connected to the third controller terminal. Moreover, the system controller includes a first resistor including a first resistor terminal and a second resistor terminal. The first resistor terminal is connected to the third controller terminal. Also, the system controller includes a second resistor including a third resistor terminal and a fourth resistor terminal. The third resistor terminal is connected to the second resistor terminal, and the fourth resistor terminal is connected to the fourth controller terminal. Additionally, the system controller includes a comparator including a first comparator terminal, a second comparator terminal and a third comparator terminal. The first comparator terminal is configured to receive a first voltage from the second resistor terminal and the third resistor terminal, and the second comparator terminal is configured to receive a reference voltage. The third comparator terminal is configured to output a comparison signal. Moreover, the system controller includes a logic controller configured to receive the comparison signal. The logic controller is further configured to, if the comparison signal indicates that after a predetermined time duration from a beginning of a start-up process of the system controller, the first voltage remains smaller than the reference voltage, generate a protection signal to turn off the first transistor and stop the start-up process.

According to yet another embodiment, a method for providing at least an output voltage includes receiving an input voltage. The input voltage is associated with an input-voltage magnitude. Additionally, the method includes receiving a control voltage, outputting an output voltage, and generating a supply voltage based at least in part on the input voltage. The supply voltage is associated with a supply voltage magnitude. Moreover, the method includes receiving the supply voltage, and generating a ramp voltage based at least in part on the supply voltage. If the control voltage is at a first logic level, the ramp voltage increases from zero to the supply voltage magnitude at a first rate of change during a first time duration, and the output voltage increases from zero to the input-voltage magnitude at a second rate of change during a second time duration. The second rate of change is equal to the first rate of change multiplied by a predetermined constant.

Depending upon embodiment, one or more benefits may be achieved. These benefits and various additional objects, features and advantages of the present invention can be fully appreciated with reference to the detailed description and accompanying drawings that follow.

4. BRIEF DESCRIPTION OF THE DRAWINGS

5. DETAILED DESCRIPTION OF THE INVENTION

Certain embodiments of the present invention are directed to integrated circuits. More particularly, some embodiments of the invention provide switching controllers and methods for loads. Merely by way of example, some embodiments of the invention have been applied to power transistors. But it would be recognized that the invention has a much broader range of applicability.

Figure 1:
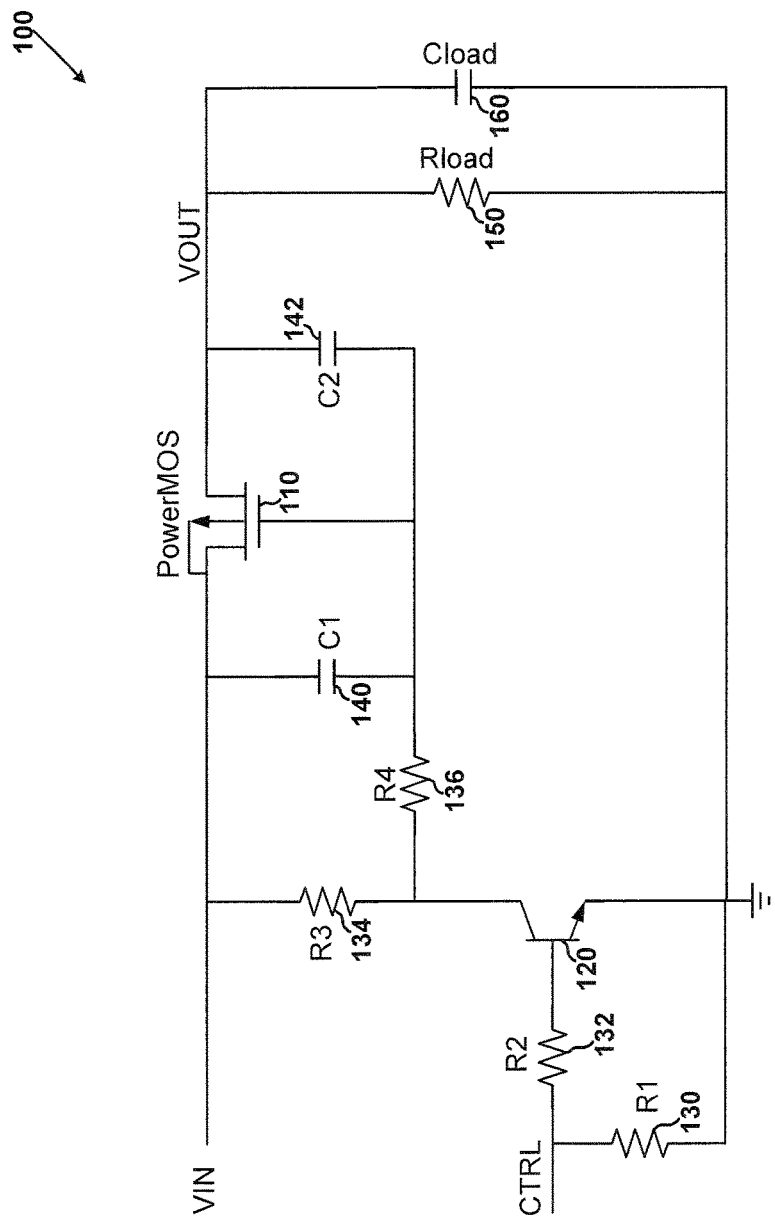
FIG. 1 is a simplified diagram showing a conventional system including discrete components for controlling ramping slope of output voltage.
Figure 2:
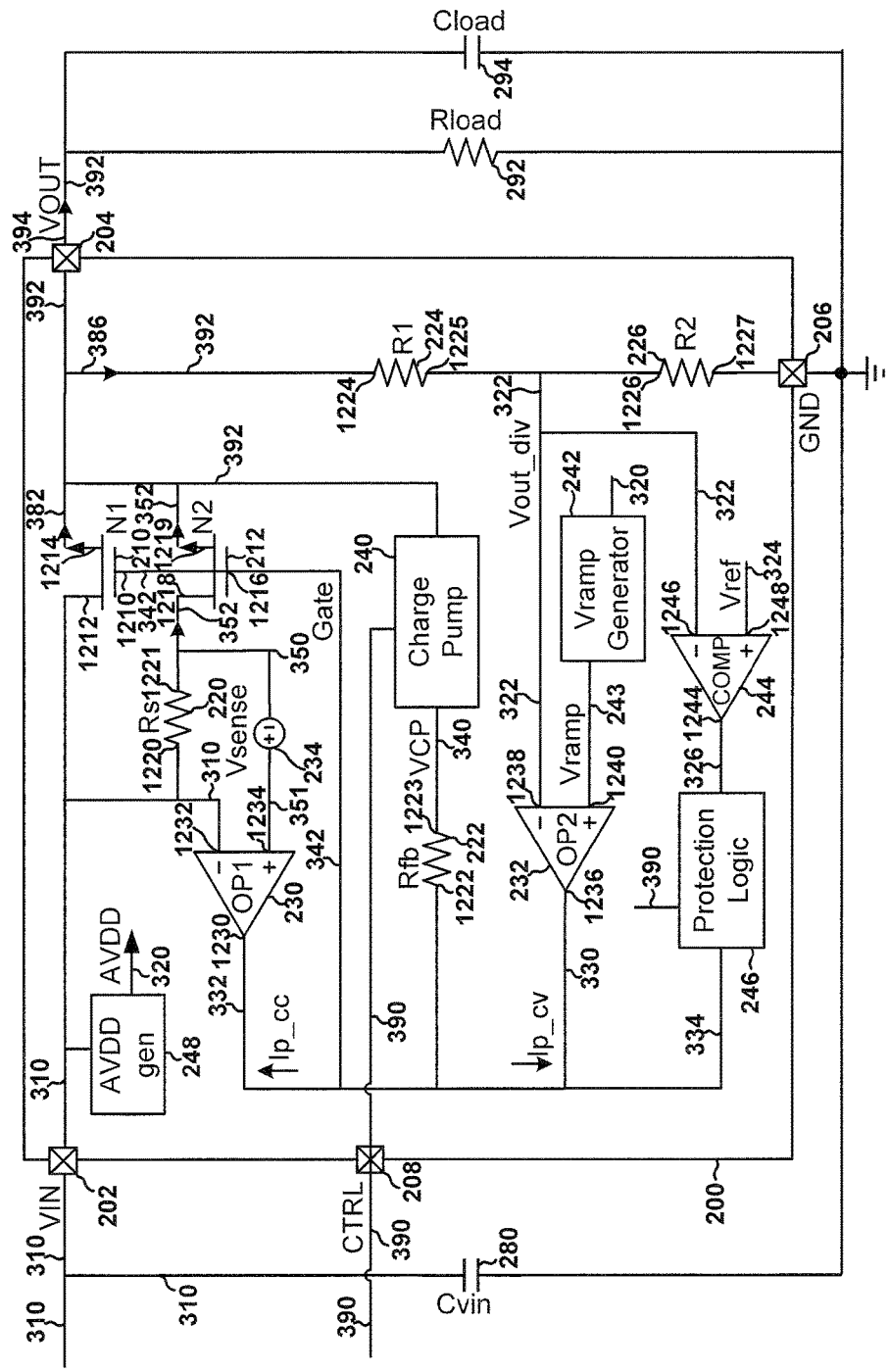
FIG. 2 is a simplified diagram showing a switching controller according to an embodiment of the present invention.

FIG. 2 is a simplified diagram showing a switching controller according to an embodiment of the present invention. This diagram is merely an example, which should not unduly limit the scope of the claims. One of ordinary skill in the art would recognize many variations, alternatives, and modifications. The switching controller 200 includes controller terminals 202, 204, 206, and 208. Additionally, the switching controller 200 includes transistors 210 and 212, resistors 220, 222, 224, and 226, transconductance operational amplifiers 230 and 232, a voltage adjuster 234, a charge pump 240, a ramp-voltage generator 242, a comparator 244, a logic controller 246, and a voltage generator 248.

For example, the switching controller 200 is a chip, and the controller terminals 202, 204, 206, and 208 are pins. In another example, the transistor 210 (e.g., a power MOSFET) includes a gate terminal 1210, a drain terminal 1212, and a source terminal 1214, and the transistor 212 includes a gate terminal 1216, a drain terminal 1218, and a source terminal 1219. In yet another example, the resistor 220 includes resistor terminals 1220 and 1221, the resistor 222 includes resistor terminals 1222 and 1223, the resistor 224 includes resistor terminals 1224 and 1225, and the resistor 226 includes resistor terminals 1226 and 1227. In yet another example, the transconductance operational amplifier 230 includes amplifier terminals 1230, 1232 and 1234, and the transconductance operational amplifier 232 includes amplifier terminals 1236, 1238 and 1240. In yet another example, the comparator 244 includes comparator terminals 1244, 1246, and 1248.

As shown in FIG. 2, the switching controller 200 receives an input voltage 310 through the controller terminal 202, receives a control signal 390 through the controller terminal 208, and outputs an output voltage 392 and an output current 394 through the controller terminal 204 according to certain embodiments. For example, the input voltage 310 is received by one terminal of a capacitor 280, and the other terminal of the capacitor 280 is grounded. In another example, the output voltage 392 is equal to the source voltage of the transistor 210 and is also equal to the source voltage of the transistor 212. In yet another example, the output voltage 392 and the output current 394 are received by a load, which includes a resistive load 292 and/or a capacitive load 294. In yet another example, the controller terminal 206 is biased to a ground voltage.

In one embodiment, through the controller terminal 202, the input voltage 310 is received by the voltage generator 248 and the drain terminal of the transistor 210. For example, in response, the voltage generator 248 generates a supply voltage 320, which is received by the ramp-voltage generator 242. In another embodiment, through the controller terminal 208, the control voltage 390 is received by the charge pump 240, which also receives the output voltage 392. In yet another embodiment, the control voltage 390 is also received by the logic controller 246.

According to certain embodiments, the charge pump 240 generates a pump voltage 340 in response to the control voltage 390. In one embodiment, if the control voltage 390 is at a logic high level, the pump voltage 340 is equal to the sum of the output voltage 392 and a predetermined voltage change, as follows:

$$V_{cp} = V_{out} + \Delta V_c \quad \text{(Equation 1)}$$

where $V_{cp}$ represents the pump voltage 340, and $V_{out}$ represents the output voltage 392. Additionally, $\Delta V_c$ represents the predetermined voltage change that is larger than a threshold voltage of the transistor 210 and also larger than a threshold voltage of the transistor 212.

For example, the predetermined voltage change is larger than zero. In another example, the output voltage 392 is equal to the source voltage of the transistor 210 and is also equal to the source voltage of the transistor 212; therefore, Equation 1 becomes:

$$V_{cp} - V_{source} = \Delta V_c = \quad \text{(Equation 2)}$$

where $V_{source}$ represents the source voltage of the transistor 210 and also represents the source voltage of the transistor 212. Additionally, $V_{cp}$ represents the pump voltage 340. Moreover, $\Delta V_c$ represents the predetermined voltage change that is larger than the threshold voltage of the transistor 210 and also larger than the threshold voltage of the transistor 212.

In another example, the predetermined voltage change is selected to be larger than the threshold voltage of the transistor 210 and also to be larger than the threshold voltage of the transistor 212; hence if the pump voltage 340 is equal to the gate voltage of the transistor 210 and is also equal to the gate voltage of the transistor 212, both the transistor 210 and the transistor 212 are turned on.

In another embodiment, if the control voltage 390 is at a logic low level, the pump voltage 340 is equal to the output voltage 392 as follows:

$$V_{cp} = V_{out} \quad \text{(Equation 3)}$$

where $V_{cp}$ represents the pump voltage 340, and $V_{out}$ represents the output voltage 392.

For example, the output voltage 392 is equal to the source voltage of the transistor 210 and is also equal to the source voltage of the transistor 212; therefore, Equation 1 becomes:

$$V_{cp} - V_{source} = 0 \quad \text{(Equation 4)}$$

where $V_{source}$ represents the source voltage of the transistor 210 and also represents the source voltage of the transistor 212. Additionally, $V_{cp}$ represents the pump voltage 340.

In another example, both the threshold voltage of the transistor 210 and the threshold voltage of the transistor 212 are larger than zero; hence if the pump voltage 340 is equal to the gate voltage of the transistor 210 and is also equal to the gate voltage of the transistor 212, both the transistor 210 and the transistor 212 are turned off, the output voltage 392 is biased to the ground voltage through the controller terminal 206 and the resistors 224 and 226, and the output current 394 is equal to zero.

According to one embodiment, the ramp-voltage generator 242 generates a ramp voltage 243. For example, the ramp voltage 243 increases from zero volts to the supply voltage 320 during a constant time duration (e.g., $T_{ramp}$). In another example, the ramp voltage 243 is received by the transconductance operational amplifier 232.

According to another embodiment, the ramp-voltage generator 242 generates the ramp voltage 243 by using a constant current to charge a large capacitor when the ramp voltage 243 increases. In yet another embodiment, the ramp-voltage generator 242 generates the ramp voltage 243 by using a pulse current to charge a small capacitor when the ramp voltage 243 increases. For example, such use of a small capacitor can reduces physical size of the capacitor and thus saves costs.

In one embodiment, the resistors 224 and 226 form a voltage divider, which receives the output voltage 392 and outputs a voltage 322. For example, the voltage 322 is received by the transconductance operational amplifier 232. In another example, the transconductance operational amplifier 232 generates an amplified current 330 based at least in part on the voltage 322 and the ramp voltage 243. In yet another example, if the voltage 322 is larger than the ramp voltage 243, the amplified current 330 flows into the transconductance operational amplifier 232. In yet another example, if the voltage 322 is smaller than the ramp voltage 243, the amplified current 330 flows out of the transconductance operational amplifier 232.

In another embodiment, a current 352 flows through the resistor 220 and the transistor 212. For example, the resistor 220 includes one resistor terminal that is at the input voltage 310, and another resistor terminal that is at a voltage 350. In another example, the voltage 350 is received by the voltage adjuster 234, which in response, generates a voltage 351, as follows:

$$V_{351} = V_{350} + \Delta V_L \quad \text{(Equation 5)}$$

where $V_{351}$ represents the voltage 351, and $V_{350}$ represents the voltage 350. Additionally, $\Delta V_L$ represents a predetermined offset voltage that is provided by the voltage adjuster 234.

In yet another embodiment, the input voltage 310 and the voltage 351 are received by the transconductance operational amplifier 230, which generates an amplified current 332. In yet another example, if the input voltage 310 is larger than the voltage 351, the amplified current 332 flows into the transconductance operational amplifier 230. In yet another example, if the input voltage 310 is smaller than the voltage 351, the amplified current 332 flows out of the transconductance operational amplifier 230.

According to one embodiment, the amplified current 330 that flows into the transconductance operational amplifier 232 and the amplified current 332 that flows into the transconductance operational amplifier 230 are used to adjust a gate voltage 342 through the resistor 222. For example, if the control voltage 390 is at the logic high level and the pump voltage 340 is determined according to Equation 1, such adjustment to the gate voltage 342 ensures that the output voltage 392 increases at a constant rate of change and also ensures that the maximum magnitude of the output current 394 does not exceed a predetermined threshold. In another example, the gate voltage 342 is received by the gate terminal 1210 of the transistor 210, and the gate voltage 342 is also received by the gate terminal 1216 of the transistor 212. In yet another example, the gate terminal 1210 of the transistor 210 and the gate terminal 1216 of the transistor 212 are directly connected.

According to another embodiment, the comparator 244 receives the voltage 322 and a reference voltage 324 and generates a comparison signal 326. For example, the comparison signal 326 is received by the logic controller 246. In another example, if the comparison signal 326 indicates that, after a predetermined time duration from the beginning of the start up process of the switching controller 200, the voltage 322 remains smaller than the reference voltage 324, then the logic controller 246 turns off the transistors 210 and 212 and also stops the start up process.

Figure 3:
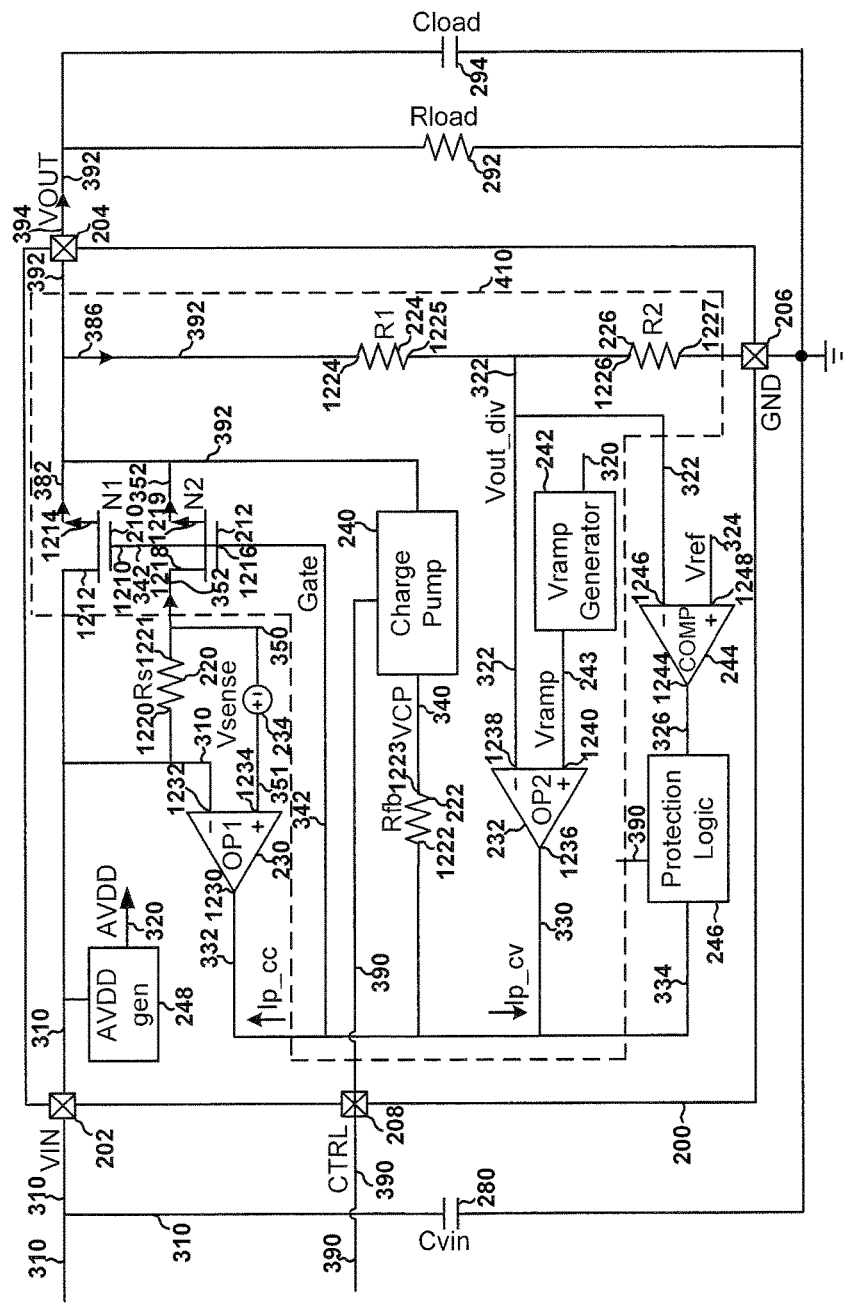
FIG. 3 is a simplified diagram showing a voltage-control module of the switching controller as shown in FIG. 2 according to an embodiment of the present invention.
Figure 5:
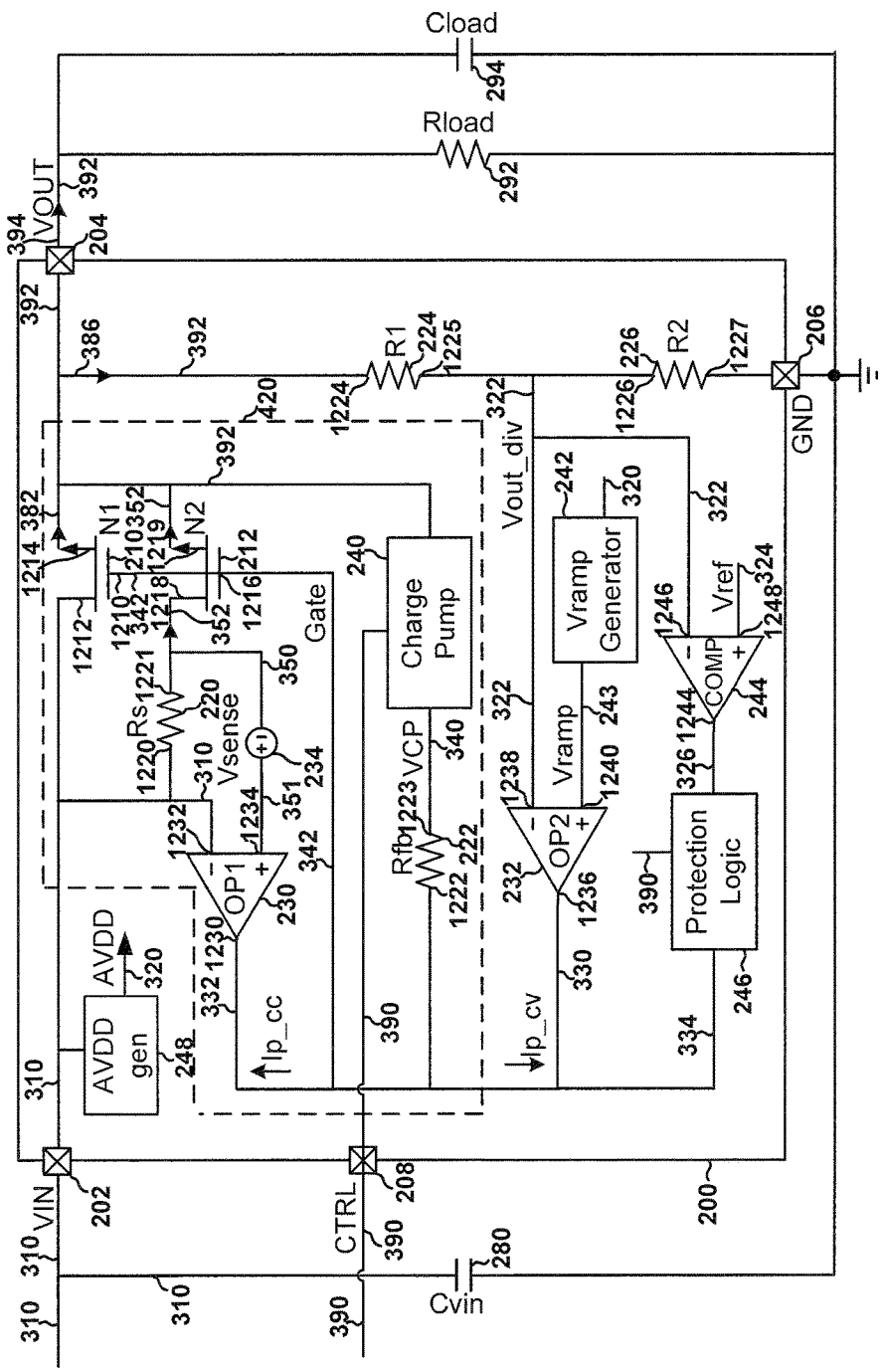
FIG. 5 is a simplified diagram showing a current-control module of the switching controller as shown in FIG. 2 according to an embodiment of the present invention.
Figure 6:
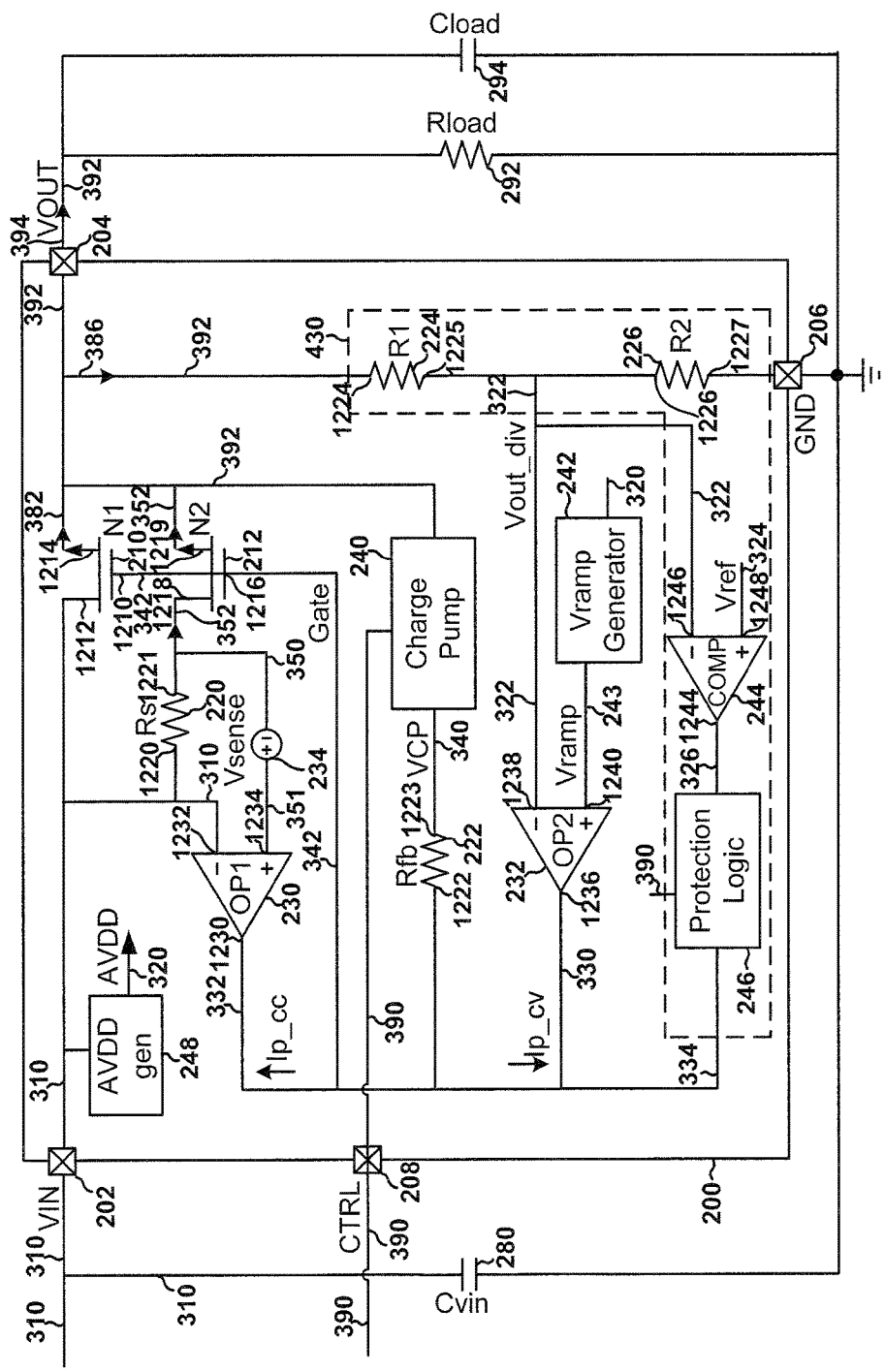
FIG. 6 is a simplified diagram showing a protection module of the switching controller as shown in FIG. 2 according to an embodiment of the present invention.

According to some embodiments, the switching controller 200 includes a voltage-control module (e.g., a voltage-control module 410 as shown in FIG. 3), a current-control module (e.g. a current-control module 420 as shown in FIG. 5), and a protection module (e.g., a protection module 430 as shown in FIG. 6).

FIG. 3 is a simplified diagram showing a voltage-control module of the switching controller 200 as shown in FIG. 2 according to an embodiment of the present invention. This diagram is merely an example, which should not unduly limit the scope of the claims. One of ordinary skill in the art would recognize many variations, alternatives, and modifications. The voltage-control module 410 includes the transistors 210 and 212, the resistors 222, 224 and 226, the transconductance operational amplifier 232, the charge pump 240, and the ramp-voltage generator 242.

In one embodiment, the ramp-voltage generator 242 generates the ramp voltage 243. For example, the ramp voltage 243 increases from zero volts to the supply voltage 320 during the constant time duration (e.g., $T_{ramp}$). In another example, the ramp voltage 243 is received by the transconductance operational amplifier 232.

In another embodiment, the resistors 224 and 226 form the voltage divider, which receives the output voltage 392 and outputs the voltage 322. For example, the voltage 322 is received by the transconductance operational amplifier 232. In another example, the transconductance operational amplifier 232 generates the amplified current 330 based at least in part on the voltage 322 and the ramp voltage 243. In yet another example, if the voltage 322 is larger than the ramp voltage 243, the amplified current 330 flows into the transconductance operational amplifier 232. In yet another example, if the voltage 322 is smaller than the ramp voltage 243, the amplified current 330 flows out of the transconductance operational amplifier 232.

According to one embodiment, the charge pump 240 generates the pump voltage 340 in response to the control voltage 390. For example, if the control voltage 390 is at the logic low level, the pump voltage 340 is equal to the output voltage 392. In another example, if the control voltage 390 is at the logic high level, the pump voltage 340 is equal to the sum of the output voltage 392 and the predetermined voltage.

According to another embodiment, the amplified current 330 that flows into the transconductance operational amplifier 232 is used to adjust the gate voltage 342 through the resistor 222. For example, the gate voltage 342 is determined as follows:

$$V_{gate} = V_{cp} - I_{p\_cv} \times R_{fb}$$ (Equation 6)

where $V_{gate}$ represents the gate voltage 342, and $V_{cp}$ represents the pump voltage 340. Additionally, $I_{p\_cv}$ represents the amplified current 330 that flows into the transconductance operational amplifier 232, and $R_{fb}$ represents the resistance of the resistor 222.

According to yet another embodiment, the gate voltage 342 is received by the transistors 210 and 212. For example, if the control voltage 390 is at the logic high level and the pump voltage 340 is equal to the sum of the output voltage 392 and the predetermined voltage according to Equation 1, the gate voltage 342 turns on the transistors 210 and 212. In another example, if the control voltage 390 is at the logic high level and the pump voltage 340 is equal to the sum of the output voltage 392 and the predetermined voltage according to Equation 1, the gate voltage 342 uses a negative-feedback control loop to ensure that the output voltage 392 increases at the predetermined rate.

Figure 4:
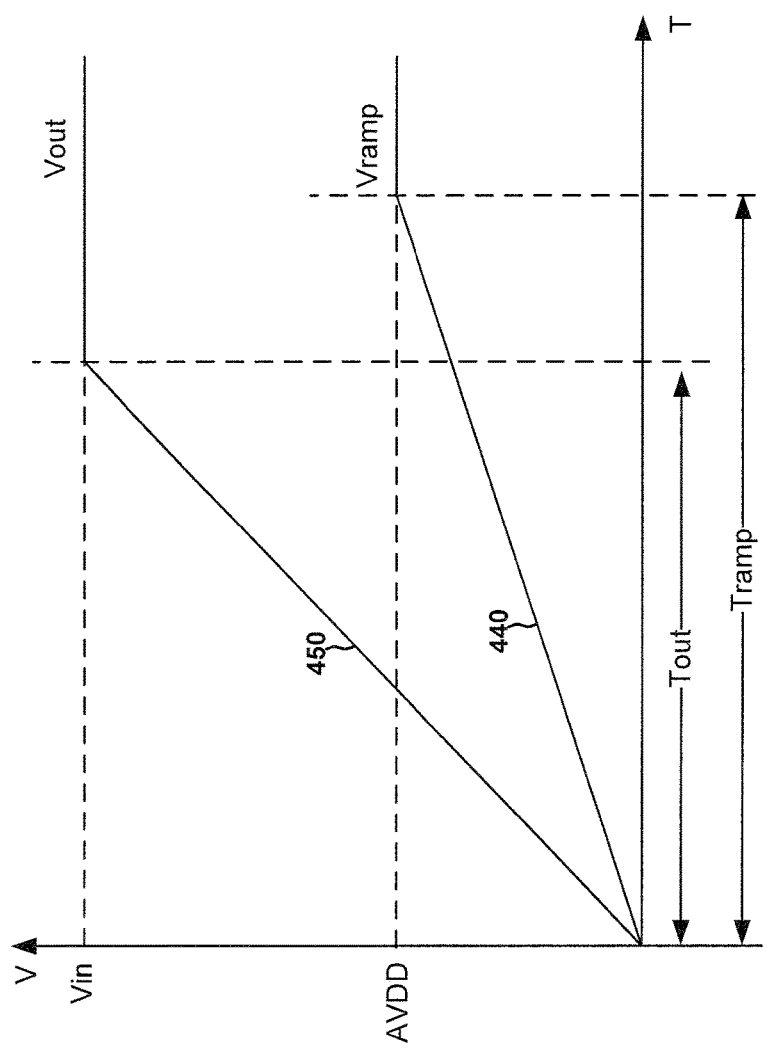
FIG. 4 is a simplified diagram showing changes of the output voltage and the ramp voltage generated by the voltage-control module as shown in FIGS. 2 and 3 as functions of time according to an embodiment of the present invention.

FIG. 4 is a simplified diagram showing changes of the output voltage 392 and the ramp voltage 243 generated by the voltage-control module 410 as shown in FIGS. 2 and 3 as functions of time according to an embodiment of the present invention. This diagram is merely an example, which should not unduly limit the scope of the claims. One of ordinary skill in the art would recognize many variations, alternatives, and modifications. A waveform 440 represents the ramp voltage 243 as a function of time if the control voltage 390 is at the logic high level and the pump voltage 340 is equal to the sum of the output voltage 392 and the predetermined voltage according to Equation 1, and a waveform 450 represents the output voltage 392 as a function of time if the control voltage 390 is at the logic high level and the pump voltage 340 is equal to the sum of the output voltage 392 and the predetermined voltage according to Equation 1.

In one embodiment, the ramp voltage 243 increases from zero volts to the voltage 320 (e.g., AVDD) during the constant time duration (e.g., $T_{ramp}$). For example, as shown by the waveform 440, during the constant time duration (e.g., $T_{ramp}$), the ramp voltage 243 increases at the constant rate of change (e.g., $S_{ramp}$). In another embodiment, the output voltage 392 increases from zero volts to the input voltage 310 (e.g., $V_{in}$) during a constant time duration (e.g., $T_{out}$). For example, as shown by the waveform 450, during the constant time duration (e.g., $T_{out}$), the output voltage 392 increases at a constant rate of change (e.g., $S_{out}$).

According to one embodiment, during the constant time duration (e.g., $T_{out}$) when the output voltage 392 changes with time, the output voltage 392 and the ramp voltage 243 have the following relationship:

$$V_{out} = V_{ramp} \times \frac{R_1 + R_2}{R_2}$$ (Equation 7)

where $V_{out}$ represents the output voltage 392, and $V_{ramp}$ represents the ramp voltage 243. Additionally, $R_1$ represents the resistance of the resistor 224, and $R_2$ represents the resistance of the resistor 226.

According to another embodiment, during the constant time duration (e.g., $T_{out}$) when the output voltage 392 changes with time, the constant rate of change of the output voltage 392 and the constant rate of change of the ramp voltage 243 have the following relationship:

$$S_{out} = S_{ramp} \times M_R \quad \text{(Equation 8A)}$$

$$M_R = \frac{R_1 + R_2}{R_2} \quad \text{(Equation 8B)}$$

where $S_{out}$ represents the constant rate of change of the output voltage 392, and $S_{ramp}$ represents the constant rate of change of the ramp voltage 243. Additionally, $M_R$ represents a predetermined constant. Moreover, $R_1$ represents the resistance of the resistor 224, and $R_2$ represents the resistance of the resistor 226.

According to yet another embodiment, as shown in Equations 8A and 8B, during the constant time duration (e.g., $T_{out}$) when the output voltage 392 changes with time, the constant rate of change of the output voltage 392 (e.g., $S_{out}$) is determined by the constant rate of change of the ramp voltage 243 (e.g., $S_{ramp}$), the resistance of the resistor 224 (e.g., $R_1$), and the resistance of the resistor 226 (e.g., $R_2$). For example, the constant rate of change of the output voltage 392 (e.g., $S_{out}$) does not change with different magnitudes of the resistive load 292 and/or different magnitudes of the capacitive load 294. In another example, the constant rate of change of the output voltage 392 can be adjusted according to Equation 7, so that the constant rate of change of the output voltage 392 can satisfy the system requirement.

FIG. 5 is a simplified diagram showing a current-control module of the switching controller 200 as shown in FIG. 2 according to an embodiment of the present invention. This diagram is merely an example, which should not unduly limit the scope of the claims. One of ordinary skill in the art would recognize many variations, alternatives, and modifications. The current-control module 420 includes the transistors 210 and 212, the resistors 220 and 222, the transconductance operational amplifier 230, the voltage adjuster 234, and the charge pump 240.

As shown in FIG. 5, the source of the transistor 210 and the source of the transistor 212 are directly connected, the drain of the transistor 210 and the drain of the transistor 212 are directly connected, and the gate of the transistor 210 and the gate of the transistor 212 are directly connected according to some embodiments.

In one embodiment, a current 382 flowing through the transistor 210 and the current 352 flowing through the transistor 212 have the following relationship:

$$I_1 = K \times I_2 \quad \text{(Equation 9)}$$

where $I_1$ represents the current 382, and $I_2$ represents current 352. Additionally, K represents a ratio of the width of the transistor 210 over the width of the transistor 212.

In another embodiment, the output current 394 is determined as follows:

$$I_{out} = I_1 + I_2 + I_3 \quad \text{(Equation 10)}$$

where $I_{out}$ represents the output current 394. Additionally, $I_1$ represents the current 382, $I_2$ represents the current 352, and $I_3$ represents a current 386 that flows through the resistors 224 and 226.

For example, using Equation 9, Equation 10 becomes:

$$I_{out} = (K+1) \times I_2 + I_3 \quad \text{(Equation 11)}$$

In another example, the resistance of the resistor 224 and the resistance of the resistor 226 are large and the current 386 is small, so that:

$$I_{out} = (K+1) \times I_2 + I_3 \approx (K+1) \times I_2 \quad \text{(Equation 12)}$$

where $I_{out}$ represents the output current 394. Additionally, $I_2$ represents the current 352, and K represents a ratio of the width of the transistor 210 over the width of the transistor 212.

In yet another embodiment, the current 352 flows through the resistor 220 and the transistor 212. For example, the resistor 220 includes one resistor terminal that is at the input voltage 310, and another resistor terminal that is at the voltage 350. In another example, the voltage 350 is received by the voltage adjuster 234, which in response, generates the voltage 351 as shown by Equation 5.

In yet another example, the input voltage 310 and the voltage 351 are received by the transconductance operational amplifier 230, which generates an amplified current 332. In yet another example, if the input voltage 310 is larger than the voltage 351, the amplified current 332 flows into the transconductance operational amplifier 230. In yet another example, if the input voltage 310 is smaller than the voltage 351, the amplified current 332 flows out of the transconductance operational amplifier 230.

In yet another embodiment, the input voltage 310 is larger than the voltage 350 by a voltage difference as follows.

$$\Delta V = R_s \times I_2 \quad \text{(Equation 13)}$$

where $\Delta V$ represents the voltage difference equal to the input voltage 310 minus the voltage 350. Additionally, $R_s$ represents the resistance of the resistor 220, and $I_2$ represents the current 352.

For example, based on Equations 5 and 13, the amplified current 332 flows into the transconductance operational amplifier 230 if Equation 14 is satisfied:

$$\Delta V > \Delta V_L \quad \text{(Equation 14)}$$

where $\Delta V$ represents the voltage difference equal to the input voltage 310 minus the voltage 350, and $\Delta V_L$ represents a predetermined offset voltage that is provided by the voltage adjuster 234.

In another example, based on Equations 5 and 13, the amplified current 332 flows out of the transconductance operational amplifier 230 if Equation 15 is satisfied:

$$\Delta V < \Delta V_L \quad \text{(Equation 15)}$$

where $\Delta V$ represents the voltage difference equal to the input voltage 310 minus the voltage 350, and $\Delta V_L$ represents a predetermined offset voltage that is provided by the voltage adjuster 234.

According to one embodiment, the amplified current 332 that flows into the transconductance operational amplifier 230 is used to adjust the gate voltage 342 through the resistor 222. For example, the gate voltage 342 is determined as follows:

$$V_{gate} = V_{cp} - I_{p\_cc} \times R_{fb} \quad \text{(Equation 16)}$$

where $V_{gate}$ represents the gate voltage 342, and $V_{cp}$ represents the pump voltage 340. Additionally, $I_{p\_cc}$ represents the amplified current 332 that flows into the operational amplifier 239, and $R_{fb}$ represents the resistance of the resistor 222.

According to another embodiment, the gate voltage 342 is received by the transistors 210 and 212. For example, if the control voltage 390 is at the logic high level and the pump voltage 340 is equal to the sum of the output voltage 392 and the predetermined voltage according to Equation 1, the gate voltage 342 turns on the transistors 210 and 212. In another example, if the control voltage 390 is at the logic high level and the pump voltage 340 is equal to the sum of the output voltage 392 and the predetermined voltage according to Equation 1, the gate voltage 342 uses a negative-feedback control loop to ensure that the maximum magnitude of the output current 394 does not exceed a predetermined threshold (e.g., $I_{threshold}$). In yet another example, the predetermined threshold (e.g., $I_{threshold}$) is determined as follows:

$$I_{threshold} = \frac{\Delta V_L}{R_s} \times (K+1) \quad \text{(Equation 17)}$$

where $I_{threshold}$ represents the predetermined threshold for the maximum magnitude of the output current 394. Additionally, $\Delta V_L$ represents the predetermined offset voltage that is provided by the voltage adjuster 234, and $R_s$ represents the resistance of the resistor 220. Moreover, K represents the ratio of the width of the transistor 210 over the width of the transistor 212.

FIG. 6 is a simplified diagram showing a protection module of the switching controller 200 as shown in FIG. 2 according to an embodiment of the present invention. This diagram is merely an example, which should not unduly limit the scope of the claims One of ordinary skill in the art would recognize many variations, alternatives, and modifications. The protection module 430 includes the resistors 220 and 222, the comparator 244, and the logic controller 246.

According to one embodiment, if the input voltage 310 becomes larger than an undervoltage-lockout threshold, the switching controller 200 starts to detect the control signal 390. For example, after the input voltage 310 becomes larger than an undervoltage-lockout threshold, if the control signal 390 changes from the logic low level to the logic high level, the start-up process of the switching controller 200 begins. In another example, the logic controller 246 detects the control signal 390 changes from the logic low level to the logic high level, indicating that the start-up process of the switching controller 200 begins.

In one embodiment, the comparator 244 receives the voltage 322 and the reference voltage 324 and generates the comparison signal 326. For example, the comparison signal 326 is received by the logic controller 246. In another example, if the comparison signal 326 indicates that, after the predetermined time duration from the beginning of the start-up process of the switching controller 200, the voltage 322 remains smaller than the reference voltage 324, then the logic controller 246 generates a signal 334 to turn off the transistors 210 and 212 and also stops the start up process. In another embodiment, the protection module 430 is used to detect the abnormal situation with the resistive load 292 and/or the capacitive load 294, and to protect the system if such abnormal situation is detected. For example, the abnormal situation with the resistive load 292 and/or the capacitive load 294 is the short circuit related to the resistive load 292 and/or the capacitive load 294.

According to some embodiments, as shown in FIG. 2, in order to take into account both the amplified current 330 that flows into the transconductance operational amplifier 232 and the amplified current 332 that flows into the operational amplifier 239, Equations 6 and 16 are modified to become Equation 18:

$$V_{gate} = V_{cp} - (I_{p\_cv} + I_{p\_cc}) \times R_{fb} \quad \text{(Equation 18)}$$

where $V_{gate}$ represents the gate voltage 342, and $V_{cp}$ represents the pump voltage 340. Additionally, $I_{p\_cv}$ represents the amplified current 330 that flows into the transconductance operational amplifier 232, and $I_{p\_cc}$ represents the amplified current 332 that flows into the operational amplifier 239. Also, $R_{fb}$ represents the resistance of the resistor 222.

Certain embodiments of the present invention provide a system controller (e.g., the switching controller 200) that generates an output voltage (e.g., the output voltage 392), which increases at a rate that does not change with the resistive load (e.g., the resistive load 292) and/or the capacitive load (e.g., the capacitive load 294). For example, the output voltage (e.g., the output voltage 392) increases at the rate that is adaptive to a rate of change of a ramp voltage (e.g., the ramp voltage 243) (e.g., as shown by Equations 8A and 8B). In another example, such adaption to the rate of change of the ramp voltage is accomplished without using an external capacitor.

Some embodiments of the present invention provide a system controller (e.g., the switching controller 200) that generates an output current (e.g., the output current 394) and also ensures that the maximum magnitude of the output current (e.g., the output current 394) does not exceed a predetermined threshold. Certain embodiments of the present invention provide a system controller (e.g., the switching controller 200) that provides protection to the system if abnormal loading (e.g. short-circuit loading) occurs during the start up process of the system.

According to another embodiment, a system controller (e.g., the switching controller 200) for providing at least an output voltage includes a first controller terminal (e.g., the controller terminal 202) configured to receive an input voltage (e.g., the input voltage 310). The input voltage is associated with an input-voltage magnitude. Additionally, the system controller (e.g., the switching controller 200) includes a second controller terminal (e.g., the controller terminal 208) configured to receive a control voltage (e.g., the control voltage 390), and a third controller terminal (e.g., the controller terminal 204) configured to output an output voltage (e.g., the output voltage 392) to a load. Moreover, the system controller (e.g., the switching controller 200) includes a supply voltage generator (e.g., the voltage generator 248) configured to receive the input voltage from the first controller terminal and generate a supply voltage (e.g., the supply voltage 320). The supply voltage is associated with a supply voltage magnitude. Also, the system controller (e.g., the switching controller 200) includes a ramp voltage generator (e.g., the ramp-voltage generator 242) configured to receive the supply voltage and generate a ramp voltage (e.g., the ramp voltage 243). If the control voltage is at a first logic level, the ramp voltage increases from zero to the supply voltage magnitude at a first rate of change (e.g., $S_{ramp}$) during a first time duration (e.g., $T_{ramp}$) and the output voltage increases from zero to the input-voltage magnitude at a second rate of change (e.g., $S_{out}$) during a second time duration (e.g., $T_{out}$). The second rate of change is equal to the first rate of change multiplied by a predetermined constant (e.g., as shown in Equations 8A and 8B). For example, the system controller (e.g., the switching controller 200) is implemented according to FIG. 2, FIG. 3, and/or FIG. 4.

In another example, the system controller (e.g., the switching controller 200) further includes a fourth controller terminal (e.g., the controller terminal 206) biased to a predetermined voltage. In yet another example, if the control voltage is at a second logic level, the output voltage is equal to the predetermined voltage. In yet another example, the predetermined voltage is a ground voltage. In yet another example, the second rate of change does not change with the load. In yet another example, the load includes a resistive load (e.g., the resistive load 292). In yet another example, the load includes a capacitive load (e.g., the capacitive load 294). In yet another example, the load includes a capacitive load (e.g., the capacitive load 294) and a resistive load (e.g., the resistive load 292).

According to yet another embodiment, a system controller (e.g., the switching controller 200) for providing at least an output voltage includes a first controller terminal (e.g., the controller terminal 202) configured to receive an input voltage (e.g., the input voltage 310), a second controller terminal (e.g., the controller terminal 208) configured to receive a control voltage (e.g., the control voltage 390), a third controller terminal (e.g., the controller terminal 204) configured to output an output voltage (e.g., the output voltage 392), and a fourth controller terminal (e.g., the controller terminal 206) biased to a predetermined voltage. Additionally, the system controller (e.g., the switching controller 200) includes a transistor (e.g., the transistor 210) including a gate terminal (e.g., the gate terminal 1210), a drain terminal (e.g., the drain terminal 1212) and a source terminal (e.g., the source terminal 1214). The drain terminal is connected to the first controller terminal, and the source terminal is connected to the third controller terminal. Moreover, the system controller (e.g., the switching controller 200) includes a first resistor (e.g., the resistor 224) including a first resistor terminal (e.g., the resistor terminal 1224) and a second resistor terminal (e.g., the resistor terminal 1225). The first resistor terminal is connected to the third controller terminal. Also, the system controller (e.g., the switching controller 200) includes a second resistor (e.g., the resistor 226) including a third resistor terminal (e.g., the resistor terminal 1226) and a fourth resistor terminal (e.g., the resistor terminal 1227). The third resistor terminal is connected to the second resistor terminal, and the fourth resistor terminal is connected to the fourth controller terminal. Additionally, the system controller (e.g., the switching controller 200) includes a third resistor (e.g., the resistor 222) including a fifth resistor terminal (e.g., the resistor terminal 1223) and a sixth resistor terminal (e.g., the resistor terminal 1222). The fifth resistor terminal is configured to receive a first voltage (e.g., the pump voltage 340) related to the output voltage, and the sixth resistor terminal is connected to the gate terminal of the transistor. Moreover, the system controller (e.g., the switching controller 200) includes a ramp voltage generator (e.g., the ramp-voltage generator 242) configured to generate a ramp voltage (e.g., the ramp voltage 243), and a transconductance operational amplifier (e.g., the transconductance operational amplifier 232) including a first amplifier terminal (e.g., the amplifier terminal 1238), a second amplifier terminal (e.g., the amplifier terminal 1240) and a third amplifier terminal (e.g., the amplifier terminal 1236). The first amplifier terminal is configured to receive a second voltage (e.g., the voltage 322) from the second resistor terminal and the third resistor terminal, the second amplifier terminal is configured to receive the ramp voltage from the ramp voltage generator, and the third amplifier terminal is connected to the sixth resistor terminal and the gate terminal of the transistor. For example, the system controller (e.g., the switching controller 200) is implemented according to FIG. 2 and/or FIG. 5.

In another example, the system controller (e.g., the switching controller 200) further includes a charge pump (e.g., a charge pump 240) configured to receive the control voltage and the output voltage and generate the first voltage. In yet another example, the charge pump (e.g., a charge pump 240) is further configured to: in response to the control voltage being at a first logic level, generate the first voltage equal to a sum of the output voltage and a predetermined voltage change (e.g., the predetermined voltage change $\Delta V_c$), the predetermined voltage change being larger than zero; and in response to the control voltage being at a second logic level, generate the first voltage equal to the output voltage.

In yet another example, the predetermined voltage is a ground voltage. In yet another example, the second voltage is equal to the output voltage multiplied by a predetermined constant (e.g., the predetermined constant $M_R$) determined by at least a first resistance (e.g., the resistance $R_1$) of the first resistor and a second resistance (e.g., the resistance $R_2$) of the second resistor. In yet another example, the transconductance operational amplifier (e.g., the transconductance operational amplifier 232) is configured to, in response to the second voltage being larger than the ramp voltage, generate an amplified current flowing into the transconductance operational amplifier through the third amplifier terminal. In yet another example, the transconductance operational amplifier (e.g., the transconductance operational amplifier 232) is further configured to, in response to the second voltage being smaller than the ramp voltage, generate the amplified current flowing out of the transconductance operational amplifier through the third amplifier terminal.

According to yet another embodiment, a system controller (e.g., the switching controller 200) for providing at least an output current includes a first controller terminal (e.g., the controller terminal 202) configured to receive an input voltage (e.g., the input voltage 310), and a second controller terminal (e.g., the controller terminal 204) configured to output an output current (e.g., the output current 394). Additionally, the system controller (e.g., the switching controller 200) includes a first transistor (e.g., the transistor 210) including a first gate terminal (e.g., the gate terminal 1210), a first drain terminal (e.g., the drain terminal 1212) and a first source terminal (e.g., the source terminal 1214). The first drain terminal is configured to receive the input voltage, and the first source terminal is connected to the second controller terminal. Moreover, the system controller (e.g., the switching controller 200) includes a second transistor (e.g., the transistor 212) including a second gate terminal (e.g., the gate terminal 1216), a second drain terminal (e.g., the drain terminal 1218) and a second source terminal (e.g., the source terminal 1219). The second source terminal is connected to the second controller terminal. Also, the system controller (e.g., the switching controller 200) includes a first resistor (e.g., the resistor 220) including a first resistor terminal (e.g., the resistor terminals 1220) and a second resistor terminal (e.g., the resistor terminal 1221). The first resistor terminal is configured to receive the input voltage, and the second resistor terminal is associated with a first voltage (e.g., the voltage 350) and connected to the second drain terminal. Additionally, the system controller (e.g., the switching controller 200) includes a second resistor (e.g., the resistor 222) including a third resistor terminal (e.g., the resistor terminal 1223) and a fourth resistor terminal (e.g., the resistor terminal 1222). The third resistor terminal is configured to receive a second voltage (e.g., the pump voltage 340), and the fourth resistor terminal is connected to the first gate terminal of the first transistor and the second gate terminal of the second transistor. Moreover, the system controller (e.g., the switching controller 200) includes a transconductance operational amplifier (e.g., the transconductance operational amplifier 230) including a first amplifier terminal (e.g., the amplifier terminal 1232), a second amplifier terminal (e.g., the amplifier terminal 1234) and a third amplifier terminal (e.g., the amplifier terminal 1230). The third amplifier terminal is connected to the fourth resistor terminal, the first gate terminal of the first transistor, and the second gate terminal of the second transistor. The transconductance operational amplifier is configured to: generate an amplified current based on at least information associated with the input voltage and the first voltage; and in response to the input voltage minus the first voltage being larger than a predetermined offset voltage (e.g., the predetermined offset voltage $\Delta V_L$), generate the amplified current flowing into the transconductance operational amplifier through the third amplifier terminal. For example, the system controller (e.g., the switching controller 200) is implemented according to FIG. 2 and/or FIG. 5.

In another example, the transconductance operational amplifier (e.g., the transconductance operational amplifier 230) is further configured to, in response to the input voltage minus the first voltage being smaller than the predetermined offset voltage, generate the amplified current flowing out of the transconductance operational amplifier through the third amplifier terminal. In yet another example, the system controller (e.g., the switching controller 200) further includes a voltage adjuster configured to receive the first voltage from the second resistor terminal and the second drain terminal and generate a third voltage (e.g., the voltage 351). The third voltage is equal to a sum of the first voltage and the predetermined offset voltage.

In yet another example, the transconductance operational amplifier (e.g., the transconductance operational amplifier 230) is further configured to receive the input voltage at the first amplifier terminal, and receive the third voltage at the second amplifier terminal. In yet another example, the transconductance operational amplifier (e.g., the transconductance operational amplifier 230) is further configured to: in response to the input voltage being larger than the third voltage, generate the amplified current flowing into the transconductance operational amplifier through the third amplifier terminal; and in response to the input voltage being smaller than the third voltage, generate the amplified current flowing out of the transconductance operational amplifier through the third amplifier terminal.

In yet another example, the system controller (e.g., the switching controller 200) further includes a third controller terminal (e.g., the controller terminal 208) configured to receive a control voltage (e.g., the control voltage 390). In yet another example, the system controller (e.g., the switching controller 200) is configured to, if the control voltage is at a first logic level, keep a maximum magnitude of the output current from exceeding a predetermined threshold. In yet another example, the second controller terminal (e.g., the controller terminal 204) is further configured to output an output voltage (e.g., the output voltage 392).

In yet another example, the system controller (e.g., the switching controller 200) further includes a charge pump (e.g., a charge pump 240) configured to receive the control voltage and the output voltage and generate the second voltage. In yet another example, the charge pump (e.g., a charge pump 240) is further configured to: in response to the control voltage being at a first logic level, generate the second voltage equal to a sum of the output voltage and a predetermined voltage change (e.g., the predetermined voltage change $\Delta V_c$), the predetermined voltage change being larger than zero; and in response to the control voltage being at a second logic level, generate the second voltage equal to the output voltage.

According to yet another embodiment, a system controller (e.g., the switching controller 200) for protection includes a first controller terminal (e.g., the controller terminal 202) configured to receive an input voltage (e.g., the input voltage 310), a second controller terminal (e.g., the controller terminal 208) configured to receive a control voltage (e.g., the control voltage 390), a third controller terminal (e.g., the controller terminal 204) configured to output an output voltage (e.g., the output voltage 392), and a fourth controller terminal (e.g., the controller terminal 206) biased to a predetermined voltage. Additionally, the system controller (e.g., the switching controller 200) includes a first transistor (e.g., the transistor 210) including a first gate terminal (e.g., the gate terminal 1210), a first drain terminal (e.g., a drain terminal 1212) and a first source terminal (e.g., the source terminal 1214). The first drain terminal is connected to the first controller terminal, and the first source terminal is connected to the third controller terminal. Moreover, the system controller (e.g., the switching controller 200) includes a first resistor (e.g., the resistor 224) including a first resistor terminal (e.g., the resistor terminal 1224) and a second resistor terminal (e.g., the resistor terminal 1225). The first resistor terminal is connected to the third controller terminal. Also, the system controller (e.g., the switching controller 200) includes a second resistor (e.g., the resistor 226) including a third resistor terminal (e.g., the resistor terminal 1226) and a fourth resistor terminal (e.g., the resistor terminal 1227). The third resistor terminal is connected to the second resistor terminal, and the fourth resistor terminal is connected to the fourth controller terminal. Additionally, the system controller (e.g., the switching controller 200) includes a comparator (e.g., the comparator 244) including a first comparator terminal (e.g., the comparator terminal 1246), a second comparator terminal (e.g., the comparator terminal 1248) and a third comparator terminal (e.g., the comparator terminal 1244). The first comparator terminal is configured to receive a first voltage (e.g., the voltage 322) from the second resistor terminal and the third resistor terminal, and the second comparator terminal is configured to receive a reference voltage (e.g., the reference voltage 324). The third comparator terminal is configured to output a comparison signal (e.g., the comparison signal 326). Moreover, the system controller (e.g., the switching controller 200) includes a logic controller (e.g., the logic controller 246) configured to receive the comparison signal. The logic controller (e.g., the logic controller 246) is further configured to, if the comparison signal indicates that after a predetermined time duration from a beginning of a start-up process of the system controller (e.g., the switching controller 200), the first voltage remains smaller than the reference voltage, generate a protection signal to turn off the first transistor and stop the start-up process. For example, the system controller (e.g., the switching controller 200) is implemented according to FIG. 2 and/or FIG. 6.

In another example, the fourth controller terminal (e.g., the controller terminal 206) is biased to a ground voltage. In yet another example, the system controller (e.g., the switching controller 200) further includes a second transistor (e.g., the transistor 212) including a second gate terminal (e.g., the gate terminal 1216), a second drain terminal (e.g., the drain terminal 1218) and a second source terminal (e.g., the source terminal 1219). The second source terminal is connected to the third controller terminal (e.g., the controller terminal 204), and the second gate terminal is connected to the first gate terminal (e.g., the gate terminal 1210).

In yet another example, the logic controller (e.g., the logic controller 246) is further configured to, if the comparison signal indicates that after the predetermined time duration from the beginning of the start-up process of the system controller (e.g., the switching controller 200), the first voltage remains smaller than the reference voltage, generate the protection signal to turn off the second transistor. In yet another example, the comparator (e.g., the comparator 244) is configured to: generate the comparison signal (e.g., the comparison signal 326) at a first logic level if the reference voltage (e.g., the reference voltage 324) is smaller than the first voltage (e.g., the voltage 322) in magnitude; and generate the comparison signal (e.g., the comparison signal 326) at a second logic level if the reference voltage (e.g., the reference voltage 324) is larger than the first voltage (e.g., the voltage 322) in magnitude. In yet another example, the first logic level is a logic low level, and the second logic level is a logic high level.

In yet another example, the logic controller (e.g., the logic controller 246) is further configured to: receive the control voltage (e.g., the control voltage 390); and detect the beginning of the start-up process of the system controller (e.g., the switching controller 200) based at least in part on the control signal. In yet another example, the logic controller (e.g., the logic controller 246) is further configured to: detects that the control voltage (e.g., the control voltage 390) changes from a first logic level to a second logic level; and in response to detecting that the control voltage changes from the first logic level to the second logic level, determines that the start-up process of the system controller (e.g., the switching controller 200) begins. In yet another example, the first logic level is a logic low level, and the second logic level is a logic high level.

According to yet another embodiment, a method for providing at least an output voltage includes receiving an input voltage (e.g., the input voltage 310). The input voltage is associated with an input-voltage magnitude. Additionally, the method includes receiving a control voltage (e.g., the control voltage 390), outputting an output voltage (e.g., the output voltage 392), and generating a supply voltage (e.g., the supply voltage 320) based at least in part on the input voltage. The supply voltage is associated with a supply voltage magnitude. Moreover, the method includes receiving the supply voltage, and generating a ramp voltage (e.g., the ramp voltage 243) based at least in part on the supply voltage. If the control voltage is at a first logic level, the ramp voltage increases from zero to the supply voltage magnitude at a first rate of change (e.g., $S_{ramp}$) during a first time duration (e.g., $T_{ramp}$), and the output voltage increases from zero to the input-voltage magnitude at a second rate of change (e.g., $S_{out}$) during a second time duration (e.g., $T_{out}$). The second rate of change is equal to the first rate of change multiplied by a predetermined constant (e.g., as shown in Equations 8A and 8B). For example, the method is implemented according to FIG. 2, FIG. 3, and/or FIG. 4.

In another example, if the control voltage is at a second logic level, the output voltage is equal to the predetermined voltage. In yet another example, the predetermined voltage is a ground voltage.

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits. In yet another example, various embodiments and/or examples of the present invention can be combined.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A system controller for providing at least an output voltage, the system controller comprising:
    a first controller terminal configured to receive an input voltage, the input voltage being associated with an input-voltage magnitude;
    a second controller terminal configured to receive a control voltage;
    a third controller terminal configured to output an output voltage to a load;
    a supply voltage generator configured to receive the input voltage from the first controller terminal and generate a supply voltage, the supply voltage being associated with a supply voltage magnitude; and
    a ramp voltage generator configured to receive the supply voltage and generate a ramp voltage;
    wherein, if the control voltage is at a first logic level,
        the ramp voltage increases from zero to the supply voltage magnitude at a first rate of change during a first time duration; and
        the output voltage increases from zero to the input-voltage magnitude at a second rate of change during a second time duration;
        wherein the second rate of change is equal to the first rate of change multiplied by a predetermined constant.

2. The system controller of claim 1, and further comprising a fourth controller terminal biased to a predetermined voltage.

3. The system controller of claim 2, wherein, if the control voltage is at a second logic level, the output voltage is equal to the predetermined voltage.

4. The system controller of claim 3 wherein the predetermined voltage is a ground voltage.

5. The system controller of claim 1 wherein the second rate of change does not change with the load.

6. The system controller of claim 5 wherein the load includes a resistive load.

7. The system controller of claim 5 wherein the load includes a capacitive load.

8. The system controller of claim 7 wherein the load further includes a resistive load.

9. A system controller for providing at least an output voltage, the system controller comprising:
    a first controller terminal configured to receive an input voltage;
    a second controller terminal configured to receive a control voltage;
    a third controller terminal configured to output an output voltage;

a fourth controller terminal biased to a predetermined voltage;

a transistor including a gate terminal, a drain terminal and a source terminal, the drain terminal being connected to the first controller terminal, the source terminal being connected to the third controller terminal;

a first resistor including a first resistor terminal and a second resistor terminal, the first resistor terminal being connected to the third controller terminal;

a second resistor including a third resistor terminal and a fourth resistor terminal, the third resistor terminal being connected to the second resistor terminal, the fourth resistor terminal being connected to the fourth controller terminal;

a third resistor including a fifth resistor terminal and a sixth resistor terminal, the fifth resistor terminal being configured to receive a first voltage related to the output voltage, the sixth resistor terminal being connected to the gate terminal of the transistor;

a ramp voltage generator configured to generate a ramp voltage;

a transconductance operational amplifier including a first amplifier terminal, a second amplifier terminal and a third amplifier terminal, the first amplifier terminal being configured to receive a second voltage from the second resistor terminal and the third resistor terminal, the second amplifier terminal being configured to receive the ramp voltage from the ramp voltage generator, the third amplifier terminal being connected to the sixth resistor terminal and the gate terminal of the transistor.

10. The system controller of claim 9, and further comprising a charge pump configured to receive the control voltage and the output voltage and generate the first voltage.

11. The system controller of claim 10 wherein the charge pump is further configured to:
in response to the control voltage being at a first logic level, generate the first voltage equal to a sum of the output voltage and a predetermined voltage change, the predetermined voltage change being larger than zero; and
in response to the control voltage being at a second logic level, generate the first voltage equal to the output voltage.

12. The system controller of claim 9 wherein the predetermined voltage is a ground voltage.

13. The system controller of claim 12 wherein the second voltage is equal to the output voltage multiplied by a predetermined constant determined by at least a first resistance of the first resistor and a second resistance of the second resistor.

14. The system controller of claim 9 wherein the transconductance operational amplifier is configured to, in response to the second voltage being larger than the ramp voltage, generate an amplified current flowing into the transconductance operational amplifier through the third amplifier terminal.

15. The system controller of claim 14 wherein the transconductance operational amplifier is further configured to, in response to the second voltage being smaller than the ramp voltage, generate the amplified current flowing out of the transconductance operational amplifier through the third amplifier terminal.

16. A system controller for providing at least an output current, the system controller comprising:
a first controller terminal configured to receive an input voltage;
a second controller terminal configured to output an output current;
a first transistor including a first gate terminal, a first drain terminal and a first source terminal, the first drain terminal being configured to receive the input voltage, the first source terminal being connected to the second controller terminal;
a second transistor including a second gate terminal, a second drain terminal and a second source terminal, the second source terminal being connected to the second controller terminal;
a first resistor including a first resistor terminal and a second resistor terminal, the first resistor terminal being configured to receive the input voltage, the second resistor terminal being associated with a first voltage and connected to the second drain terminal;
a second resistor including a third resistor terminal and a fourth resistor terminal, the third resistor terminal being configured to receive a second voltage, the fourth resistor terminal being connected to the first gate terminal of the first transistor and the second gate terminal of the second transistor;
a transconductance operational amplifier including a first amplifier terminal, a second amplifier terminal and a third amplifier terminal, the third amplifier terminal being connected to the fourth resistor terminal, the first gate terminal of the first transistor, and the second gate terminal of the second transistor;
wherein the transconductance operational amplifier is configured to:
generate an amplified current based on at least information associated with the input voltage and the first voltage; and
in response to the input voltage minus the first voltage being larger than a predetermined offset voltage, generate the amplified current flowing into the transconductance operational amplifier through the third amplifier terminal.

17. The system controller of claim 16 wherein the transconductance operational amplifier is further configured to, in response to the input voltage minus the first voltage being smaller than the predetermined offset voltage, generate the amplified current flowing out of the transconductance operational amplifier through the third amplifier terminal.

18. The system controller of claim 16, and further comprising a voltage adjuster configured to receive the first voltage from the second resistor terminal and the second drain terminal and generate a third voltage, the third voltage being equal to a sum of the first voltage and the predetermined offset voltage.

19. The system controller of claim 18 wherein the transconductance operational amplifier is further configured to:
receive the input voltage at the first amplifier terminal; and
receive the third voltage at the second amplifier terminal.

20. The system controller of claim 19 wherein the transconductance operational amplifier is further configured to:
in response to the input voltage being larger than the third voltage, generate the amplified current flowing into the transconductance operational amplifier through the third amplifier terminal; and
in response to the input voltage being smaller than the third voltage, generate the amplified current flowing out of the transconductance operational amplifier through the third amplifier terminal.

21. The system controller of claim 16, and further comprising a third controller terminal configured to receive a control voltage.

22. The system controller of claim 21 is configured to, if the control voltage is at a first logic level, keep a maximum magnitude of the output current from exceeding a predetermined threshold.

23. The system controller of claim 21 wherein the second controller terminal is further configured to output an output voltage.

24. The system controller of claim 23, and further comprising a charge pump configured to receive the control voltage and the output voltage and generate the second voltage.

25. The system controller of claim 24 wherein the charge pump is further configured to:
in response to the control voltage being at a first logic level, generate the second voltage equal to a sum of the output voltage and a predetermined voltage change, the predetermined voltage change being larger than zero; and
in response to the control voltage being at a second logic level, generate the second voltage equal to the output voltage.

26. A system controller for protection, the system controller comprising:
a first controller terminal configured to receive an input voltage;
a second controller terminal configured to receive a control voltage;
a third controller terminal configured to output an output voltage;
a fourth controller terminal biased to a predetermined voltage;
a first transistor including a first gate terminal, a first drain terminal and a first source terminal, the first drain terminal being connected to the first controller terminal, the first source terminal being connected to the third controller terminal;
a first resistor including a first resistor terminal and a second resistor terminal, the first resistor terminal being connected to the third controller terminal;
a second resistor including a third resistor terminal and a fourth resistor terminal, the third resistor terminal being connected to the second resistor terminal, the fourth resistor terminal being connected to the fourth controller terminal;
a comparator including a first comparator terminal, a second comparator terminal and a third comparator terminal, the first comparator terminal being configured to receive a first voltage from the second resistor terminal and the third resistor terminal, the second comparator terminal being configured to receive a reference voltage, the third comparator terminal being configured to output a comparison signal;
a logic controller configured to receive the comparison signal;
wherein the logic controller is further configured to, if the comparison signal indicates that after a predetermined time duration from a beginning of a start-up process of the system controller, the first voltage remains smaller than the reference voltage, generate a protection signal to turn off the first transistor and stop the start-up process.

27. The system controller of claim 26 wherein the fourth controller terminal is biased to a ground voltage.

28. The system controller of claim 26, and further comprising:
a second transistor including a second gate terminal, a second drain terminal and a second source terminal;
wherein:
the second source terminal is connected to the third controller terminal; and
the second gate terminal is connected to the first gate terminal.

29. The system controller of claim 28 wherein the logic controller is further configured to, if the comparison signal indicates that after the predetermined time duration from the beginning of the start-up process of the system controller, the first voltage remains smaller than the reference voltage, generate the protection signal to turn off the second transistor.

30. The system controller of claim 26 wherein the comparator is configured to:
generate the comparison signal at a first logic level if the reference voltage is smaller than the first voltage in magnitude; and
generate the comparison signal at a second logic level if the reference voltage is larger than the first voltage in magnitude.

31. The system controller of claim 30 wherein:
the first logic level is a logic low level; and
the second logic level is a logic high level.

32. The system controller of claim 26 wherein the logic controller is further configured to:
receive the control voltage; and
detect the beginning of the start-up process of the system controller based at least in part on a control signal.

33. The system controller of claim 32 wherein the logic controller is further configured to:
detects that the control voltage changes from a first logic level to a second logic level; and
in response to detecting that the control voltage changes from the first logic level to the second logic level, determines that the start-up process of the system controller begins.

34. The system controller of claim 33 wherein:
the first logic level is a logic low level; and
the second logic level is a logic high level.

35. A method for providing at least an output voltage, the method comprising:
receiving an input voltage, the input voltage being associated with an input-voltage magnitude;
receiving a control voltage;
outputting an output voltage;
generating a supply voltage based at least in part on the input voltage, the supply voltage being associated with a supply voltage magnitude; and
receiving the supply voltage; and
generating a ramp voltage based at least in part on the supply voltage;
wherein, if the control voltage is at a first logic level,
the ramp voltage increases from zero to the supply voltage magnitude at a first rate of change during a first time duration; and
the output voltage increases from zero to the input-voltage magnitude at a second rate of change during a second time duration;
wherein the second rate of change is equal to the first rate of change multiplied by a predetermined constant.

36. The method of claim 35, wherein, if the control voltage is at a second logic level, the output voltage is equal to a predetermined voltage.

37. The method of claim 36 wherein the predetermined voltage is a ground voltage.

\* \* \* \* \*